(12) United States Patent
Ryu et al.

(10) Patent No.: US 8,357,929 B2
(45) Date of Patent: Jan. 22, 2013

(54) ORGANIC LIGHT EMITTING DISPLAY DEVICE

(75) Inventors: Ji-Hun Ryu, Yongin (KR); Seung-Yong Song, Yongin (KR); Young-Seo Choi, Yongin (KR); Oh-June Kwon, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 215 days.

(21) Appl. No.: 12/603,552

(22) Filed: Oct. 21, 2009

(65) Prior Publication Data

US 2010/0244057 A1    Sep. 30, 2010

(30) Foreign Application Priority Data

Mar. 24, 2009 (KR) .................. 10-2009-0024984

(51) Int. Cl.
*H01L 35/24* (2006.01)
(52) U.S. Cl. .......................................... 257/40; 257/88
(58) Field of Classification Search .................. 257/40, 257/88, 59, 72, E51.018
See application file for complete search history.

(56) References Cited

U.S. PATENT DOCUMENTS

| | | |
|---|---|---|
| 2002/0079494 A1 | 6/2002 | Kim et al. |
| 2003/0122476 A1 | 7/2003 | Wang et al. |
| 2007/0172971 A1 | 7/2007 | Boroson |
| 2009/0009046 A1* | 1/2009 | Oh et al. ........................ 313/1 |
| 2009/0064717 A1 | 3/2009 | Son et al. |
| 2010/0045181 A1 | 2/2010 | Oh et al. |

FOREIGN PATENT DOCUMENTS

| | | |
|---|---|---|
| CN | 101335291 A | 12/2008 |
| EP | 2 009 715 A2 | 12/2008 |
| JP | 2000-030858 | 1/2000 |
| JP | 2003-203763 | 7/2003 |
| JP | 2008-210648 | 9/2008 |
| JP | 2008-210788 | 9/2008 |
| JP | 2008-218393 | 9/2008 |
| JP | 2009-009923 | 1/2009 |
| KR | 10-2003-0092873 | 12/2003 |
| KR | 10-2009-0000314 A | 1/2009 |
| KR | 10-20100047366 A | 5/2010 |
| KR | 10-20100047367 A | 5/2010 |

OTHER PUBLICATIONS

European Search Report and Written Opinion for Application No. EP 10 15 4587, dated Jun. 9, 2010, 7 pages.

* cited by examiner

*Primary Examiner* — Jack Chen
(74) *Attorney, Agent, or Firm* — Christie, Parker & Hale, LLP

(57) ABSTRACT

An organic light emitting display device, including: a first substrate on which a plurality of light emitting elements are formed; a second substrate that is disposed to be opposed to the first substrate; a primary dam member that is provided between the first substrate and the second substrate in order to surround the plurality of light emitting elements; a filler that is filled between the first substrate and the second substrate and in a first region defined by the primary dam member, an auxiliary dam member that is between the first substrate and the second substrate and in a second region outside the first region, and is made of porous material; and an inorganic sealant that is provided between the first substrate and the second substrate and in a third region outside the first region and the second region, and is jointed to the first substrate and the second substrate.

12 Claims, 4 Drawing Sheets

ORGANIC LIGHT EMITTING DISPLAY DEVICE

CROSS-REFERENCE TO RELATED APPLICATION

This application claims priority to and the benefit of Korean Patent Application No. 10-2009-0024984, filed on Mar. 24, 2009, in the Korean Intellectual Property Office, the entire content of which is incorporated herein by reference.

BACKGROUND

1. Field of the Invention

The following description relates to an organic light emitting display device.

2. Discussion of Related Art

An organic light emitting display device has a relatively high viewing angle, high contrast, high response speed, low power consumption, etc., so that its field of applications has been expanded from a personal portable equipment such as an MP3 player and a cellular phone to a television (TV). In addition, the thickness of the organic light emitting display device has been gradually reduced due to user demand.

However, if the thickness of the organic light emitting display device is reduced too much, it may cause a difficulty in securing mechanical reliability of the organic light emitting display device if the device is dropped and/or distorted. That is, if the mechanical reliability of the organic light emitting display device is not secured, its sealing can be easily broken even by a small impact so that life span characteristics thereof are deteriorated.

In particular, since organic light emitting elements that constitute a pixel include organic material that is relatively weak against attack from moisture and/or oxygen, material of an accompanying sealant has a great influence on the mechanical reliability of the organic light emitting display device and in protecting the organic light emitting elements from moisture and/or oxygen using the sealant.

SUMMARY OF THE INVENTION

An aspect of an embodiment of the present invention is directed toward an organic light emitting display device that can effectively block infiltration of moisture or oxygen and improve mechanical reliability.

An aspect of an embodiment of the present invention is directed toward an organic light emitting display device that can prevent or protect an inorganic sealant from being contaminated by a sealant.

An aspect of an embodiment of the present invention is directed toward an organic light emitting display device in which a space between a substrate on which a light emitting device is formed and a sealing substrate is filled with a sealant.

An embodiment of the present invention provides an organic light emitting display device. The organic light emitting display device includes: a first substrate; a plurality of light emitting elements on the first substrate; a second substrate facing the first substrate; a primary dam member between the first substrate and the second substrate and surrounding the plurality of light emitting elements; a filler filled between the first substrate and the second substrate and in a first region defined by the primary dam member; an auxiliary dam member between the first substrate and the second substrate and in a second region outside the first region, the auxiliary dam member being composed of porous material; and an inorganic sealant between the first substrate and the second substrate and in a third region outside the first region and the second region, the inorganic sealant being jointed to the first substrate and the second substrate.

Here, the organic light emitting display device can effectively block infiltration of moisture and/or oxygen by using the inorganic sealant and/or improve pressure-resistance characteristics, making it possible to have high life span characteristics and mechanical reliability. Also, since the filler overflowing the dam member (or the primary dam member) is absorbed by the porous auxiliary dam member while the substrate on which the light emitting elements are formed is jointed to the sealing substrate, the contamination of the inorganic sealant by the filler is blocked or prevented, making it possible to reduce or minimize the sealing defect.

BRIEF DESCRIPTION OF THE DRAWINGS

The accompanying drawings, together with the specification illustrate exemplary embodiments of the present invention, and, together with the description, serve to explain the principles of the present invention.

DETAILED DESCRIPTION

Figure 1:
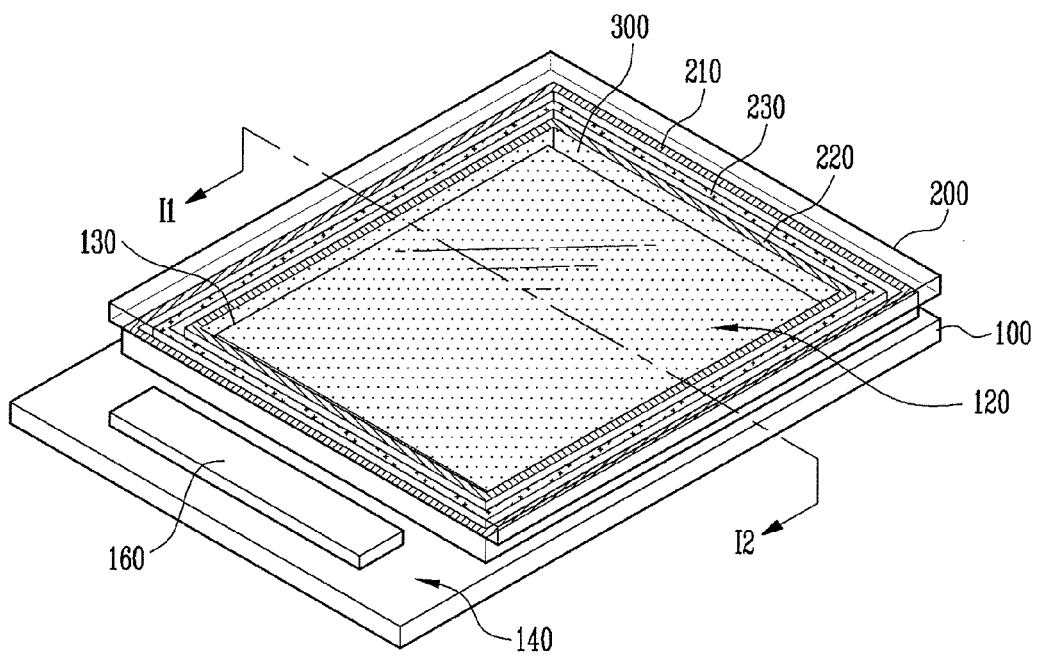
FIG. 1 is a perspective schematic view of an organic light emitting display device according to an embodiment of the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. In addition, when an element is referred to as being "on" another element, it can be directly on the another element or be indirectly on the another element with one or more intervening elements interposed therebetween. Also, when an element is referred to as being "connected to" another element, it can be directly connected to the another element or be indirectly connected to the another element with one or more intervening elements interposed therebetween. Hereinafter, like reference numerals refer to like elements.

Hereinafter, exemplary embodiments according to the present invention will be described with reference to the accompanying drawings.

A use of inorganic sealant that effectively blocks infiltration of moisture and/or oxygen may be considered as being effective in order to improve life span characteristics of an organic light emitting display device. However, the inorganic material is easily released by impact or distortion, thereby deteriorating mechanical reliability.

An embodiment of the present invention provides an organic light emitting display device having improved life span characteristics by improving the use of the inorganic sealant that effectively blocks infiltration of moisture and/or oxygen.

Figure 2:
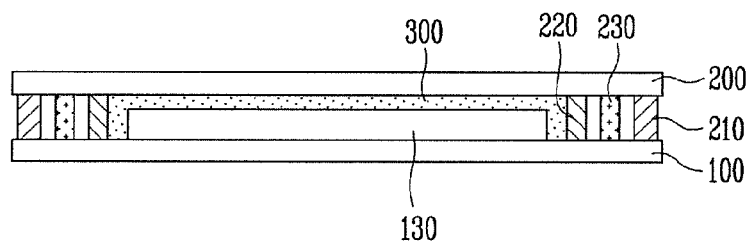
FIG. 2 is a cross-sectional schematic view of the organic light emitting display device taken along line I1-I2 of FIG. 1.

FIG. 1 is a perspective schematic view explaining an organic light emitting display device according to an embodiment of the present invention, and FIG. 2 is a cross-sectional schematic view of the organic light emitting display device taken along line I1-I2 of FIG. 1.

Referring to FIGS. 1 and 2, the organic light emitting display device includes: a substrate 100 on which a plurality of light emitting elements 130 are formed; a sealing substrate 200 facing (or opposed to) the substrate 100; a dam member (or primary dam member) 220 provided between the substrate 100 and the sealing substrate 200 and surrounding the plurality of light emitting elements 130; a filler 300 filled between the substrate 100 and the sealing substrate 200 and in a first region defined by the dam member 220 (or defined by an inner side of the dam member 220); an auxiliary dam member 230 provided between the substrate 100 and the sealing substrate 200 and in a second region outside the first region (or defined by an outer side of the dam member 220); and an inorganic sealant 210 provided between the substrate 100 and the sealing substrate 200, in the third region outside of the first and second regions (or defined by an outer side of the auxiliary dam member 230), and jointed to the substrate 100 and the sealing substrate 200.

The substrate 100 is defined with a display region 120 and a non-display region 140 that is a peripheral region of the display region 120. The plurality of light emitting elements 130 are formed in the display region 120, and a driving circuit 160 that drives the plurality of light emitting elements 130 is disposed in the non-display region 140.

Figure 3:
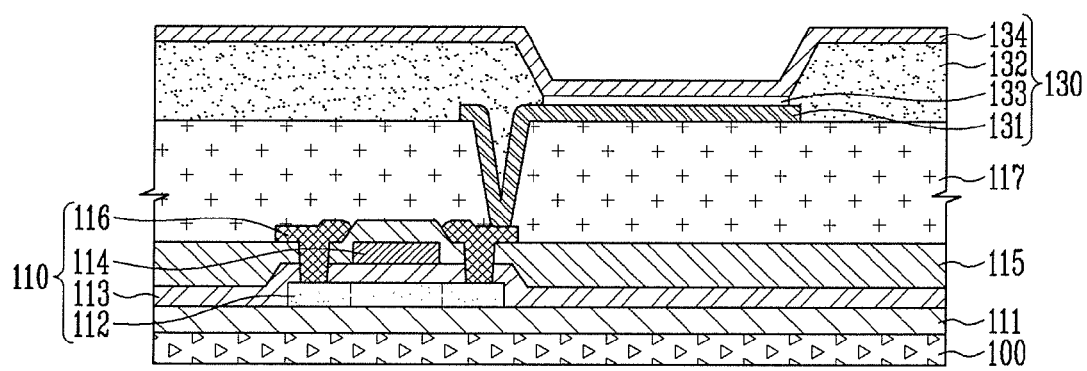
FIG. 3 is a cross-sectional schematic view of the organic light emitting elements of FIG. 1.

Referring to FIG. 3, the light emitting element 130, which is an organic light emitting element, includes an anode element 131, a cathode electrode 134, and an organic light emitting layer 133 between the anode electrode 131 and the cathode electrode 134. The organic light emitting layer 133 is formed on a light emitting region (a region where the anode electrode 131 is exposed) defined by a pixel definition layer 132. The organic light emitting layer 133 may include a hole injection layer, a hole transport layer, an electron transport layer, and an electron injection layer.

Also, a thin film transistor 110 that controls an operation and a capacitor that maintains a signal can be connected to the light emitting element 130. The thin film transistor 110 includes a semiconductor layer 112 that provides source and drain regions and a channel region, a gate electrode 114 that is insulated from the semiconductor layer 112 by a gate insulating layer 113, and source and drain electrodes 116 that are connected to the semiconductor layer 112 on the source and drain regions through a contact hole formed on an insulating layer 115 and the gate insulating layer 113. In addition, a buffer layer 111 and a planarization insulating layer 117 are provided and shown in FIG. 3.

The sealing substrate 200 is disposed to overlap with portions of the display region 120 and the non-display region. In the case of a top emission structure, the sealing substrate 200 may be made of a transparent material such as glass, and in the case of a bottom emission structure, the sealing substrate 200 may be made of an opaque material.

The inorganic sealant 210 is made of frit that is melted by laser or infrared rays to be jointed to the substrate 100 and the sealing substrate 200, etc. Such an inorganic sealant 210 is provided between the substrate 100 and the sealing substrate 200 in order to surround the light emitting elements 130, thereby preventing or blocking external moisture and/or oxygen from infiltrating the light emitting elements 130.

The filler 300 is filled in the first region between the substrate 100 and the sealing substrate 200 and defined by the dam member 220. The filler 300 is colorless (transparent) liquid-phase material having transmittance of 90% or more in a visible light region such as a glass substrate. The filler 300 may use inert liquid, liquid-phase silicon, silicon oils, epoxy-based, acryl-based, photosensitive resin, etc.

The inert liquid may be selected from the group consisting of perfluorocarbon and fluorinert that have a high stability, i.e., a reacting material that does not react or is inert to constitutes of the light emitting element 130. Also, the liquid-phase silicon and the silicon oils exemplarily have no phase-change in a temperature range from −40° C. to 100° C. and have volume variation within 5%. The silicon oils may be, for example, selected from the group consisting of hexamethyldisiloxane, octamethyltrisiloxane, decamethyltetrasiloxane, dodecamethylpentasiloxane, and polydimethylsiloxanes.

The dam member 220 maintains the shape of the filler 300 by blocking or preventing the flow of the filler 300. The dam member 220 may be made of inorganic material and/or organic material. The inorganic material may use frit, and the organic material may use epoxy, epoxy acrylate, silicons, etc. In the embodiment, the organic material is composed of bisphenol-A type epoxy, cycloaliphatics epoxy resin, phenyl silicon resin, and acrylic epoxy resin, etc.

When the filler 300 overflows the dam member 220, the auxiliary dam member 230 absorbs the overflowed filler 300 to block or prevent the filler 300 from being contacted with the inorganic sealant 210. The auxiliary dam member 230 is made of suitable porous inorganic and/or organic material that effectively absorbs liquid having a low viscosity and does not generate noxious gas. For example, the porous inorganic material may use frit, silica gel, etc., and the porous organic material may use carbon, foaming resin (Styrofoam), etc. Also, the auxiliary dam member 230 is exemplarily formed having a width between 50 and 100 μm in order to reduce or minimize a dead space and to thereby increase or maximize an absorption effect.

The present invention will be described in more detail through a method for manufacturing an organic light emitting display device according to an embodiment of the present invention.

Figure 4A:
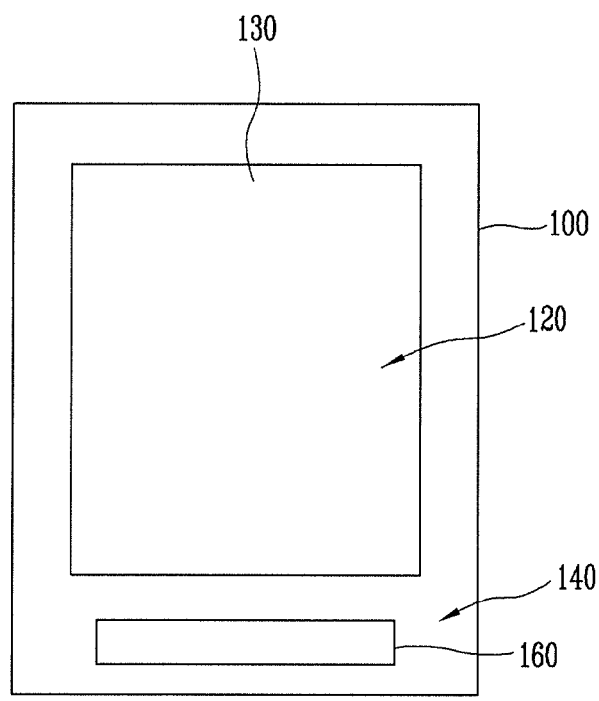
FIGS. 4A and 4B are plan schematic views showing a method for manufacturing an organic light emitting display device according to an embodiment of the present invention.
Figure 4B:
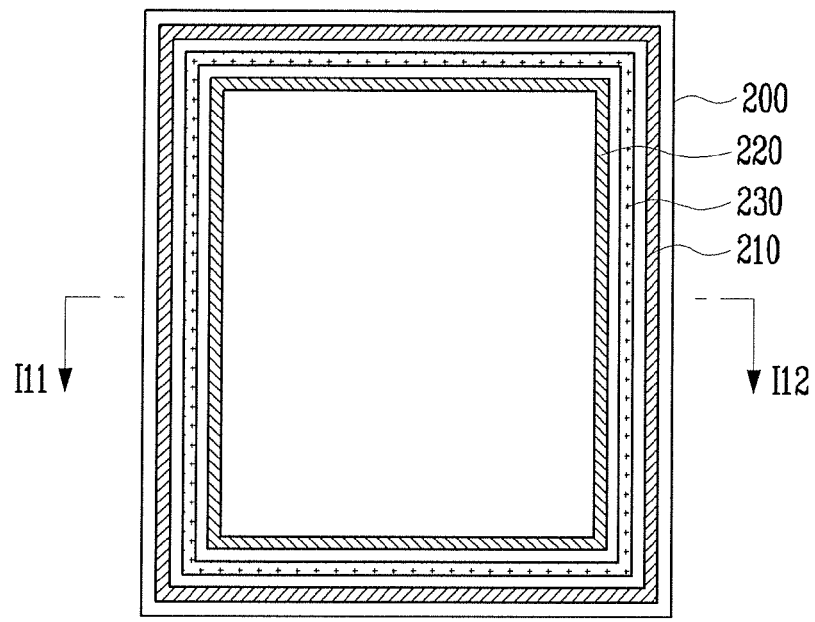

FIGS. 4A and 4B are plan schematic views showing a method for manufacturing an organic light emitting display device according to an embodiment of the present invention, and FIGS. 5A to 5E are cross-sectional schematic views showing a method for manufacturing an organic light emitting display device according to an embodiment of the present invention, wherein FIGS. 5A to 5E show a cross-section of parts of the organic light emitting display device taken along line I11-I12 of FIG. 4B.

Referring to FIG. 4A, the substrate 100 on which the plurality of light emitting elements 130 are formed is initially prepared. The substrate 100 is defined with the display region 120 and the non-display region 140 that is the peripheral region of the display region 120. The plurality of light emitting elements 130 may be formed on the substrate 100 and in the display region 120, and a driving circuit 160 that drives the light emitting elements 130 may be disposed on the substrate 100 and in the non-display region 140.

Referring to FIG. 3, the light emitting element 130 may be formed of the organic light emitting element that includes the anode electrode 131, the organic light emitting layer 133, and the cathode electrode, and may further include the thin film transistor 110 that controls an operation of the organic light emitting element and a capacitor that maintains a signal. A manufacturing process of the organic light emitting element may be appreciated by referring to Korean Laid-Open Patent Publication Nos. 2002-0047889 (laid-open publication date: Jun. 22, 2002) and 2003-0092873 (laid-open publication date: Dec. 6, 2003), the entire content of which is incorporated herein by reference.

Figure 5A:
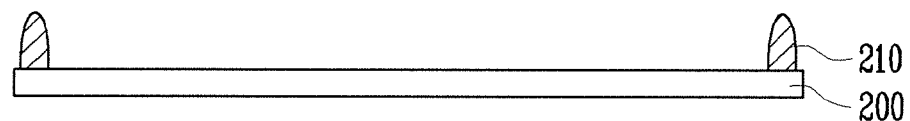
FIGS. 5A, 5B, 5C, 5D, and 5E are cross-sectional schematic views showing a method for manufacturing an organic light emitting display device according to an embodiment of the present invention.

Referring to FIGS. 4B and 5A, the sealing substrate 200 that seals the light emitting element 130 on the display region 120 is prepared. The sealing substrate 200 may have a size that is overlapped with portions of the display region 120 and the non-display region 140. The sealing substrate 200 may use a transparent substrate such as glass in the case of a top emission structure, and may use an opaque substrate in the case of a bottom emission structure.

An inorganic sealant 210 is formed along an outer region of the sealing substrate 200. The inorganic sealant 210 may use frit, wherein it is coated through a dispenser and/or screen printing process. Frit generally refers to glass raw material in a powder shape. However, in embodiments of the present invention, the frit refers to a paste with an infrared ray absorber, an organic binder, and a filler for reducing thermal expansion coefficient, etc. that are included in a main material, such as SiO2, etc. If the frit in the paste state is subject to a dry and/or burning process, the organic binder and moisture are removed so that the frit is hardened. The laser and/or infrared absorber may include a transition metal compound, exemplarily, a vanadium compound.

Figure 5B:
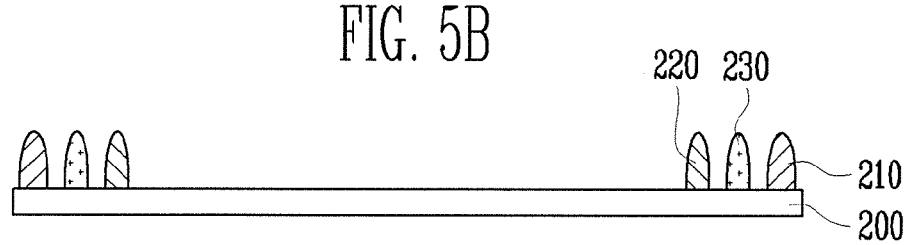

Referring to FIGS. 4B and 5B, the dam member 220 is formed on the sealing substrate 200 in a region defined by the inorganic sealant 210 (or defined by the inner side of the inorganic sealant 210) in order to surround the display region 120, and the auxiliary dam member 230 is formed on the sealing substrate 200 between the dam member 220 and the inorganic sealant 210 in order to surround the dam member 220.

The dam member 220 may be made of organic material and/or inorganic material, and the auxiliary dam member 230 may be made of porous inorganic material and/or organic material that can absorb a filler 300. The dam member 220 and the auxiliary dam member 230 may be coated through a dispenser and/or a screen printing process. Here, the coated amount is determined by considering the distance from the light emitting element 130 positioned at the outer-most portion of the display region 120 to the inorganic sealant 210 and the height of the dam member 220 and the auxiliary dam member 230. If the height of the dam member 220 and the auxiliary dam member 230 is higher than that of the inorganic sealant 210, it is difficult to join the inorganic sealant 210 to the substrate 100. Therefore, it is exemplar that the height of the dam member 220 and the auxiliary dam member 230 is equal to or lower than that of the inorganic sealant 210.

Also, the dam member 220 and the auxiliary dam member 230 made of material having low viscosity is easily collapsed so that if they in the coated state are temporarily-hardened, they are structurally hardened, making it possible to reinforce a dam function. The temporary-hardening may use heat, electron beam and/or ultraviolet rays according to the material characteristics of the material utilized.

In one embodiment, the dam member 220 and the auxiliary dam member 230 are formed after the inorganic sealant 210 is formed, however, the formation order may be changed according to the design and process conditions.

Figure 5C:
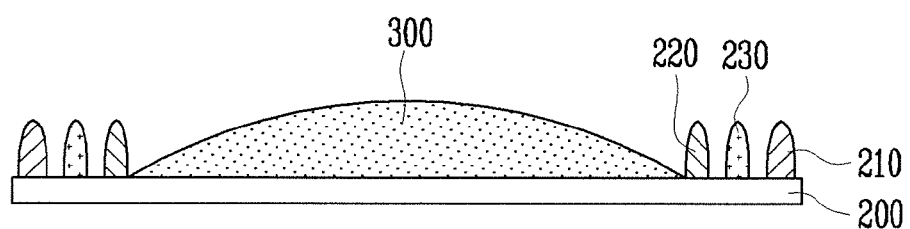

Referring to FIG. 5C, the liquid-phase filler 300 is provided to the sealing substrate 200 in the first region defined by the dam member 220 (or defined by the inner side of the dam member 220). The filler 300 may be provided through an inkjet, a dispenser, a screen printing or a one drop filling (ODF), etc. For example, the filler 300 having viscosity between 1 and 2000 cPs may be loaded onto the sealing substrate 200 in the first region defined by the inner side of the dam member 220 using the ODF equipment. In this case, the appropriate amount to volume of the theoretical inner space may be easily controlled.

Figure 5D:
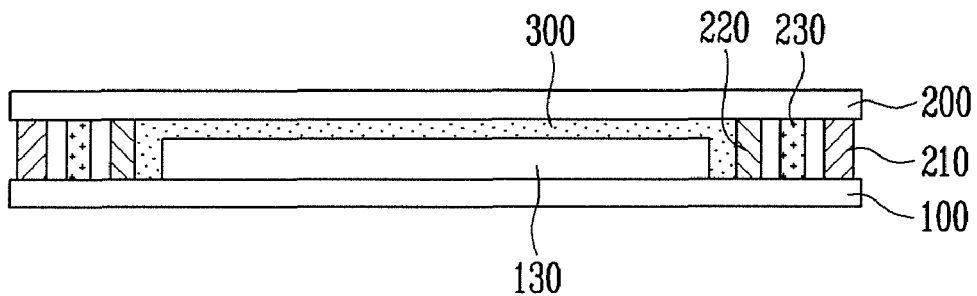

Referring to FIG. 5D, the substrate 100 and the sealing substrate 200 are then disposed to be opposed to each other. For example, the substrate 100 is mounted on an upper chuck of the junction device, the sealing substrate 200 is mounted on a lower chuck thereof, and then the substrate 100 is jointed to the sealing substrate 200. As the substrate 100 is jointed to the sealing substrate 200, the filler 300 is filled in the first region defined by the inner side of the dam member 220, and the flow of the filler 300 is prevented by the dam member 220 so that the shape of the filler 300 is maintained. Here, the substrate 100 and the sealing substrate 200 can be pressurized so that the space between the light emitting elements 130 and the sealing substrate 200 is completely filled with the filler 300.

Figure 5E:
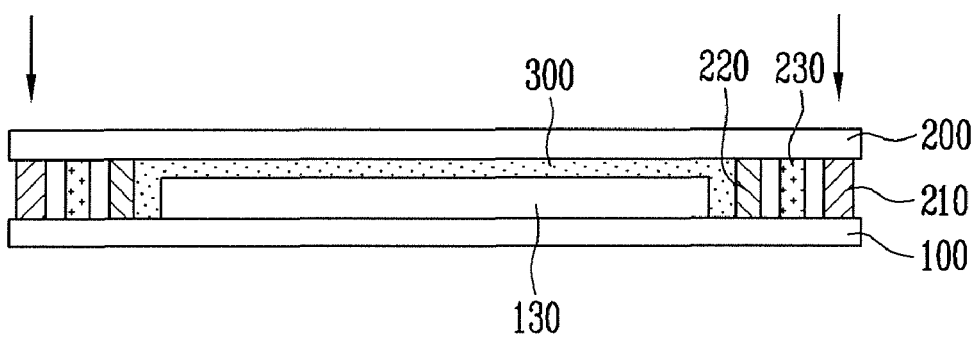

Referring to FIG. 5E, laser and/or infrared rays are emitted along the inorganic material 210 in the state where the substrate 100 is joined to the sealing substrate 200. As laser and/or infrared rays are absorbed to generate heat, the inorganic sealant 210 is melted to be jointed to the substrate 100 and the sealing substrate 200, such that the light emitting elements 130 are thereby sealed.

When emitting laser and/or infrared rays along the inorganic sealant 210, laser and/or infrared rays can be emitted only to a desired region using a mask and/or a protective film (not shown), and the filler 300 can be hardened using heat, electron beam and/or ultraviolet rays (UV) in the state where the elements 130 are sealed as described above.

Figure 6:
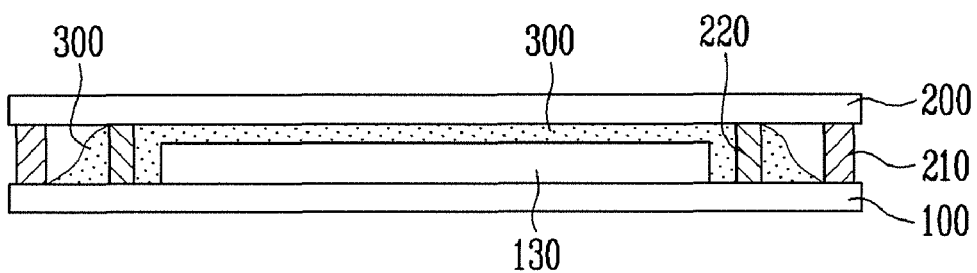
FIG. 6 is a cross-sectional schematic view of an organic light emitting display device explaining an embodiment of the present invention.

In a structure where the auxiliary dam member 230 is not provided as shown in FIG. 6, the filler 300 may contact the inorganic sealant 210 by overflowing the dam member 220 while the substrate 100 is jointed to the sealing substrate 200 as shown in FIG. 5. In this case, the inorganic sealant 210 is contaminated by the filler 300 so that when the inorganic sealant 210 is jointed to the substrate 100 by emitting laser and/or infrared rays, the inorganic sealant 210 is not completely jointed to the substrate 100 so that the sealed state is deteriorated. However, in an embodiment of the present invention having a structure where the auxiliary dam member 230 is provided, the filler 300 overflowing the dam member 220 is absorbed by the porous auxiliary dam member 230, making it possible to effectively block or prevent the inorganic sealant 210 from being contacted with the filler 300.

An embodiment of the present invention describes the case where the display region 210 is sealed by the inorganic sealant 210, however, the present invention is not limited thereto, and a driving circuit 160 may also be sealed by the inorganic sealant 210. Also, an embodiment of the present invention describes the case where the inorganic sealant 210 and the auxiliary dam member 230 are formed on the sealing substrate 200, having a single structure, however, the present invention is not limited thereto, and they may be formed on the substrate 100 and/or may be formed to have a double structure or a multiple structure (e.g., a double or multiple layers). For example, the inorganic sealant 210 may formed to have a double structure or a multiple structure in order to enhance a sealing effect, or the auxiliary dam member 220 may be formed having a double structure or a multiple structure in order to effectively block or prevent the defect due to the overflow of the filler 300.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An organic light emitting display device, comprising:
   a first substrate;
   a plurality of light emitting elements on the first substrate;
   a second substrate facing the first substrate;
   a primary dam member between the first substrate and the second substrate and surrounding the plurality of light emitting elements, the primary dam member having an inner side and an outer side spaced apart from each other;
   a filler filled between the first substrate and the second substrate and in a first region defined by the primary dam member;
   an auxiliary dam member spaced apart from the primary dam member and between the first substrate and the second substrate and in a second region outside the first region, the auxiliary dam member being composed of porous material and having an inner side and an outer side spaced apart from each other; and
   an inorganic sealant between the first substrate and the second substrate and in a third region outside the first region and the second region, the inorganic sealant being jointed to the first substrate and the second substrate.

2. The organic light emitting display device as claimed in claim 1, wherein the filler is composed of a material selected from the group consisting of inert liquids, liquid-phase silicon, silicon oils, epoxy-based resins, acryl-based resins, photosensitive resins, and combinations thereof.

3. The organic light emitting display device as claimed in claim 1, wherein the primary dam member is composed of frit.

4. The organic light emitting display device as claimed in claim 1, wherein the primary dam member comprises a material selected from the group consisting of epoxies, epoxy acrylates, bisphenol-A type epoxies, cycloaliphatics epoxy resins, phenyl silicon resins, acrylic epoxy resins, and combinations thereof.

5. The organic light emitting display device as claimed in claim 1, wherein the porous material comprises a material selected from the group consisting of frits, carbons, silica gels, foaming resins, and combinations thereof.

6. The organic light emitting display device as claimed in claim 1, wherein the auxiliary dam member has a width between about 50 and about 100 μm.

7. The organic light emitting display device as claimed in claim 1, wherein the inorganic sealant is composed of frit.

8. The organic light emitting display device as claimed in claim 7, wherein the frit is a laser or infrared ray melted frit.

9. The organic light emitting display device as claimed in claim 1, wherein the second region is between the primary dam member and the inorganic sealant.

10. An organic light emitting display device, comprising:
    a first substrate;
    a second substrate facing the first substrate;
    a plurality of light emitting elements between the first substrate and the second substrate;
    a primary dam member between the first substrate and the second substrate and surrounding the plurality of light emitting elements, the primary dam member having an inner side and an outer side spaced apart from each other;
    a filler filled between the first substrate and the second substrate and in a first region defined by the primary dam member;
    an auxiliary dam member spaced apart from the primary dam member and between the first substrate and the second substrate and in a second region outside the first region, the auxiliary dam member being composed of porous material and having an inner side and an outer side spaced apart from each other; and
    an inorganic sealant between the first substrate and the second substrate and in a third region outside the first region and the second region, the inorganic sealant being jointed to the first substrate and the second substrate.

11. An organic light emitting display device, comprising:
    a first substrate;
    a second substrate facing the first substrate;
    a plurality of light emitting elements between the first substrate and the second substrate;
    a primary dam member between the first substrate and the second substrate and surrounding the plurality of light emitting elements, the primary dam member having an inner side and an outer side spaced apart from each other;
    a filler filled between the first substrate and the second substrate and in a first region defined by the inner side of the primary dam member;
    an auxiliary dam member spaced apart from the primary dam member and between the first substrate and the second substrate and in a second region defined by the outer side of the primary dam member, the auxiliary dam member being composed of porous material and having an inner side and an outer side spaced apart from each other; and
    an inorganic sealant between the first substrate and the second substrate and in a third region defined by an outer side of the auxiliary dam member, the inorganic sealant being jointed to the first substrate and the second substrate.

12. The organic light emitting display device as claimed in claim 11, wherein the second region is further defined by an inner side of the inorganic sealant facing the outer side of the primary dam member.

* * * * *